(12) United States Patent
Aiyoshi

(10) Patent No.: US 12,190,191 B2
(45) Date of Patent: Jan. 7, 2025

(54) CARD READER

(71) Applicant: NIDEC SANKYO CORPORATION, Nagano (JP)

(72) Inventor: Hiroyuki Aiyoshi, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 374 days.

(21) Appl. No.: 17/598,903

(22) PCT Filed: Feb. 20, 2020

(86) PCT No.: PCT/JP2020/006761
§ 371 (c)(1),
(2) Date: Sep. 28, 2021

(87) PCT Pub. No.: WO2020/202879
PCT Pub. Date: Oct. 8, 2020

(65) Prior Publication Data
US 2022/0164552 A1 May 26, 2022

(30) Foreign Application Priority Data
Mar. 29, 2019 (JP) .................. 2019-065372

(51) Int. Cl.
*G06K 7/00* (2006.01)
*H05K 1/02* (2006.01)
*H05K 1/14* (2006.01)

(52) U.S. Cl.
CPC ......... *G06K 7/0021* (2013.01); *H05K 1/0277* (2013.01); *H05K 1/14* (2013.01)

(58) Field of Classification Search
CPC ....... G06K 7/0021; H05K 1/0277; H05K 1/14
See application file for complete search history.

(56) References Cited

U.S. PATENT DOCUMENTS 6,834,801 B2 * 12/2004 Ishikawa .............. G06K 7/0026
235/441
9,697,390 B2 * 7/2017 Kuwaki ............... G06K 7/0026
(Continued)

FOREIGN PATENT DOCUMENTS

CN 105706106 6/2016
CN 108628404 10/2018
(Continued)

OTHER PUBLICATIONS

"Office Action of China Counterpart Application", issued on Apr. 22, 2023, with English translation thereof, pp. 1-13.
(Continued)

Primary Examiner — Thien M Le
Assistant Examiner — Asifa Habib
(74) Attorney, Agent, or Firm — JCIPRNET

(57) ABSTRACT

To provide a card reader that encrypts information acquired via an IC contact block. A card reader includes: an IC contact block including a contact spring capable of being in contact with an external connection terminal of an IC chip of a card; a flexible printed board to which a spring end of the contact spring is coupled; an encryption circuit mounted on the flexible printed board and electrically connected to the contact spring to encrypt information acquired from the IC chip via the IC contact block; and a resin sealing member that integrally covers the spring end and the encryption circuit.

1 Claim, 7 Drawing Sheets

(56) References Cited

U.S. PATENT DOCUMENTS

| | | | |
|---|---|---|---|
| 11,443,123 B2* | 9/2022 | Haller | G06K 7/0021 |
| 2015/0102106 A1* | 4/2015 | Choi | G06K 7/084 |
| | | | 235/449 |
| 2016/0125207 A1* | 5/2016 | Aiyoshi | G06K 7/084 |
| | | | 235/440 |
| 2018/0150663 A1* | 5/2018 | Akahane | G06K 7/10009 |
| 2019/0005277 A1* | 1/2019 | Miyazawa | G06K 7/06 |
| 2019/0087611 A1* | 3/2019 | Takita | G11B 5/00808 |
| 2019/0130935 A1* | 5/2019 | Higashi | G06K 7/08 |

FOREIGN PATENT DOCUMENTS

| | | |
|---|---|---|
| EP | 3379405 | 9/2018 |
| JP | 2014081931 | 5/2014 |
| JP | 2016091107 | 5/2016 |
| JP | 2019008713 | 1/2019 |

OTHER PUBLICATIONS

"International Search Report (Form PCT/ISA/210) of PCT/JP2020/006761", mailed on May 19, 2020, with English translation thereof, pp. 1-4.

"Office Action of China Counterpart Application", issued on Oct. 25, 2023, with English translation thereof, pp. 1-11.

"Notification of Reexamination of China Counterpart Application", issued on Aug. 20, 2024, with English translation thereof, p. 1-p. 13.

* cited by examiner (a)

(b)

CARD READER

CROSS-REFERENCE TO RELATED APPLICATION

This application is a 371 application of the international PCT application serial no. PCT/JP2020/006761, filed on Feb. 20, 2020, which claims the priority benefits of Japan application no. 2019-065372 filed on Mar. 29, 2019. The entirety of each of the above-mentioned patent applications is hereby incorporated by reference herein and made a part of this specification.

TECHNICAL FIELD

The present invention relates to a card reader that handles a card including an IC chip.

BACKGROUND ART

Patent Literature 1 discloses a card reader that performs operations on a card including an IC chip. The card reader in this patent literature includes a card passage extending through a read position for reading information in the IC chip. At the read position, an IC contact block is provided, which may be in contact with the IC chip of the card on the passage. The card reader causes the IC chip and the IC contact block to be in contact with each other for a communication at the read position and acquires the information stored in the IC chip. Furthermore, the card reader transmits the acquired information to a higher-level device.

CITATION LIST

Patent Literature

[Patent Literature 1] Japanese Patent Application Publication No. 2016-91107

SUMMARY OF THE INVENTION

Problems to be Solved by the Invention

There may be fraudulent acquisition of information transmitted from the card reader to the higher-level device. As a measure against such a fraud, it is possible to encrypt information transmitted from the card reader to the higher-level device.

In view of the above disadvantage, the present invention has an object to provide a card reader capable of encrypting information acquired via an IC contact block.

Means for Solving the Problem

In order to solve the above issue, a card reader according to an embodiment of the present invention includes: an integrated circuit (IC) contact block including a contact spring capable of being in contact with an external connection terminal of an integrated circuit chip built in a card; a flexible printed board to which a spring end of the contact spring is coupled; an encryption circuit mounted on the flexible printed board and electrically connected to the contact spring to encrypt information acquired from the integrated circuit chip via the integrated circuit contact block; and a resin sealing member that integrally covers the spring end and the encryption circuit.

According to an embodiment of the present invention, the contact spring of the IC contact block is coupled to the flexible printed board where the encryption circuit is mounted. Accordingly, the encryption circuit may encrypt information acquired from the IC chip of the card via the IC contact block. Furthermore, the resin sealing member integrally covers the spring end of the contact spring and the encryption circuit. Thus, the resin sealing member seals the spring end of the contact spring, the wiring pattern coupling the spring end and the encryption circuit on the flexible printed board, and the encryption circuit. This leads to difficulty in external physical access to the spring end of the contact spring, the wiring pattern coupling the spring end and the encryption circuit on the flexible printed board, and the encryption circuit. Thus, it is possible to prevent a person who intends to commit a fraud from acquiring unencrypted information. Moreover, as the encryption circuit is mounted on the flexible printed board, the encryption circuit including the board may be made small as compared to the case where the encryption circuit is mounted on a rigid board.

According to an embodiment of the present invention, the integrated circuit contact block may include a holder that holds the contact spring, the holder may be in contact with a first surface of the flexible printed board, the spring end may project from a contact surface of the holder in contact with the flexible printed board, the spring end may be coupled to the flexible printed board in such a manner that the spring end penetrates the flexible printed board from a side of the first surface to a side of a second surface opposite to the first surface, the encryption circuit may be mounted on the second surface of the flexible printed board, and the resin sealing member may be provided on the side of the second surface of the flexible printed board. Accordingly, the flexible printed board having the encryption circuit mounted thereon may be overlapped with the IC contact block. Moreover, as the spring end of the IC contact block penetrates the flexible printed board, the coupling strength between the IC contact block and the flexible printed board is high as compared to the case where the spring end of the IC contact block is coupled to one side of the flexible printed board.

The flexible printed board may include: a first board portion having the first surface extending in contact with the integrated circuit contact block; a second board portion facing the first board portion with a gap interposed therebetween on the side of the second surface of the first board portion; and a coupling board portion coupling the first board portion and the second board portion, the spring end may penetrate the first board portion, and the encryption circuit may include: a first circuit portion mounted on the second surface of the first board portion; and a second circuit portion mounted on the second surface of the second board portion. Accordingly, it is easy to ensure the area for mounting the encryption circuit on the flexible printed board.

Furthermore, as the first board portion and the second board portion are overlapped with each other, the encryption circuit may be made compact while the area for mounting the encryption circuit on the flexible printed board is ensured.

According to an embodiment of the present invention, the second board portion is preferably overlapped with the spring end when viewed in a facing direction in which the first board portion and the second board portion face each other. Accordingly, it is more difficult for a person who intends to commit a fraud to physically access the spring end.

According to an embodiment of the present invention, the resin sealing member preferably seals a gap between the first board portion and the second board portion and covers the second board portion on the side of the first surface and the coupling board portion. This leads to a state where the resin sealing member covers the first board portion, the second board portion, the coupling board portion, the first circuit portion, the second circuit portion, and the spring end. Accordingly, it is difficult to identify what is sealed inside the resin sealing member. Therefore, it is more difficult for a person who intends to commit a fraud to acquire unencrypted information.

Effect of the Invention

According to an embodiment of the present invention, information acquired from the IC chip of the card via the IC contact block may be encrypted by the encryption circuit at the encryption circuit. Furthermore, as the resin sealing member integrally covers the spring end of the contact spring and the encryption circuit, it is difficult to physically access the spring end, the wiring pattern coupling the spring end and the encryption circuit, and the encryption circuit. Accordingly, it is difficult to acquire unencrypted information. Moreover, as the encryption circuit is mounted on the flexible printed board, the encryption circuit including the board may be made small as compared to the case where the encryption circuit is mounted on a rigid board.

MODE FOR CARRYING OUT THE INVENTION

A card reader according to an embodiment of the present invention is described below with reference to the drawings.
(Overall Configuration)

Figure 1:
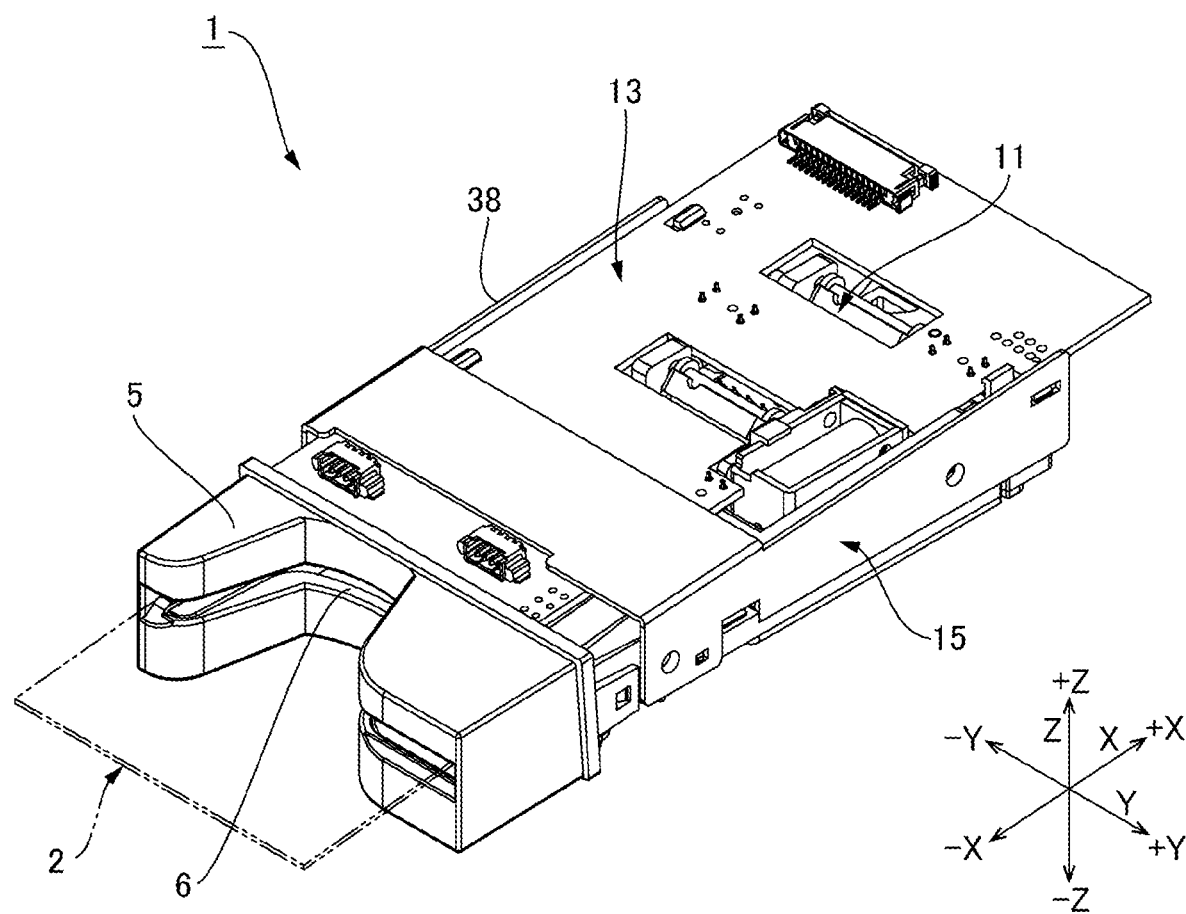
FIG. 1 is a perspective view of a card reader to which the present invention is applied.
Figure 2:
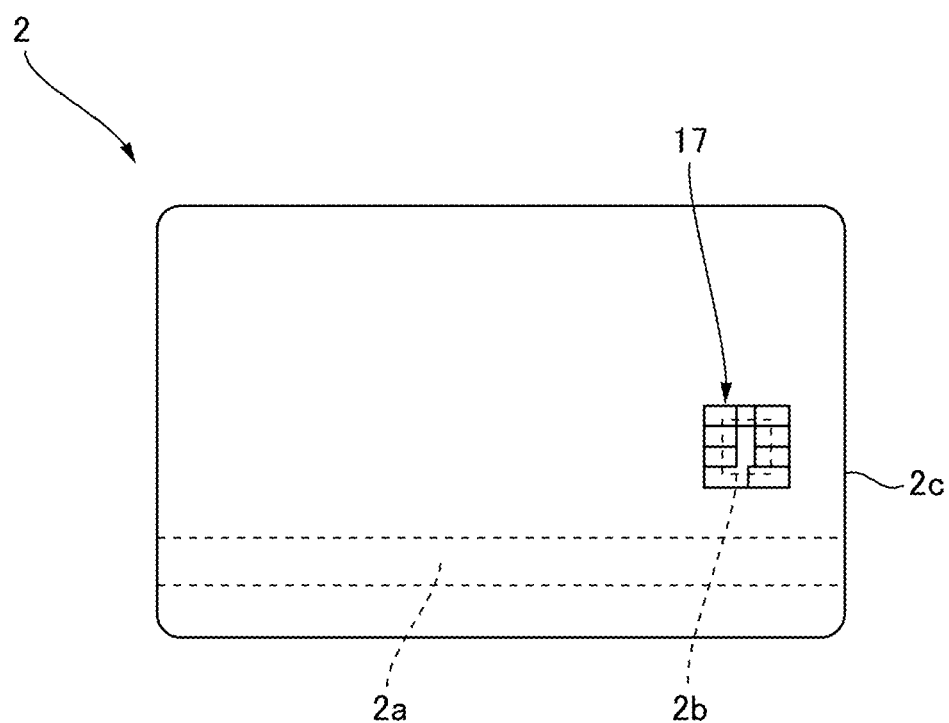
FIG. 2 is a plan view of a card to be processed by the card reader.
Figure 3:
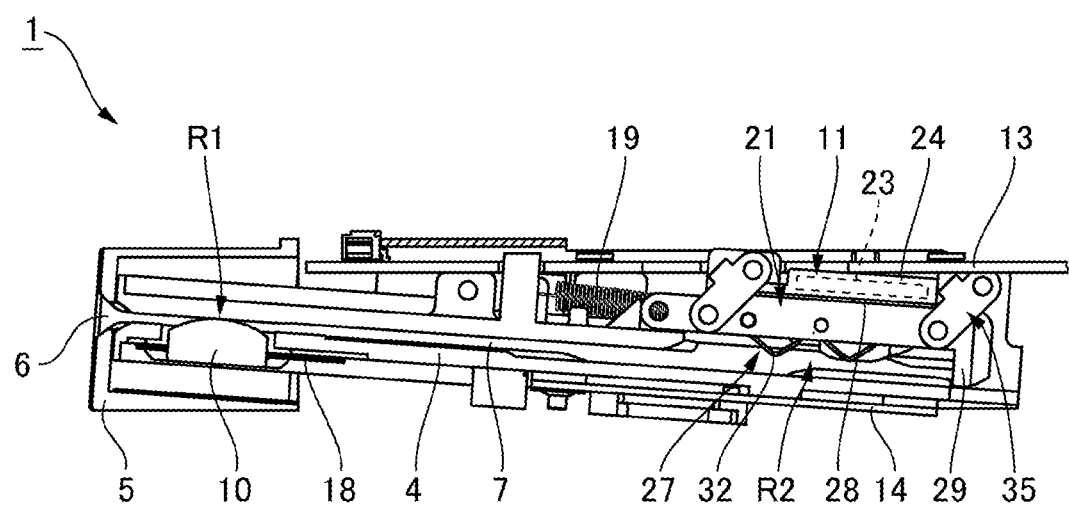
FIG. 3 is an explanatory diagram of an internal structure of the card reader.
Figure 4:
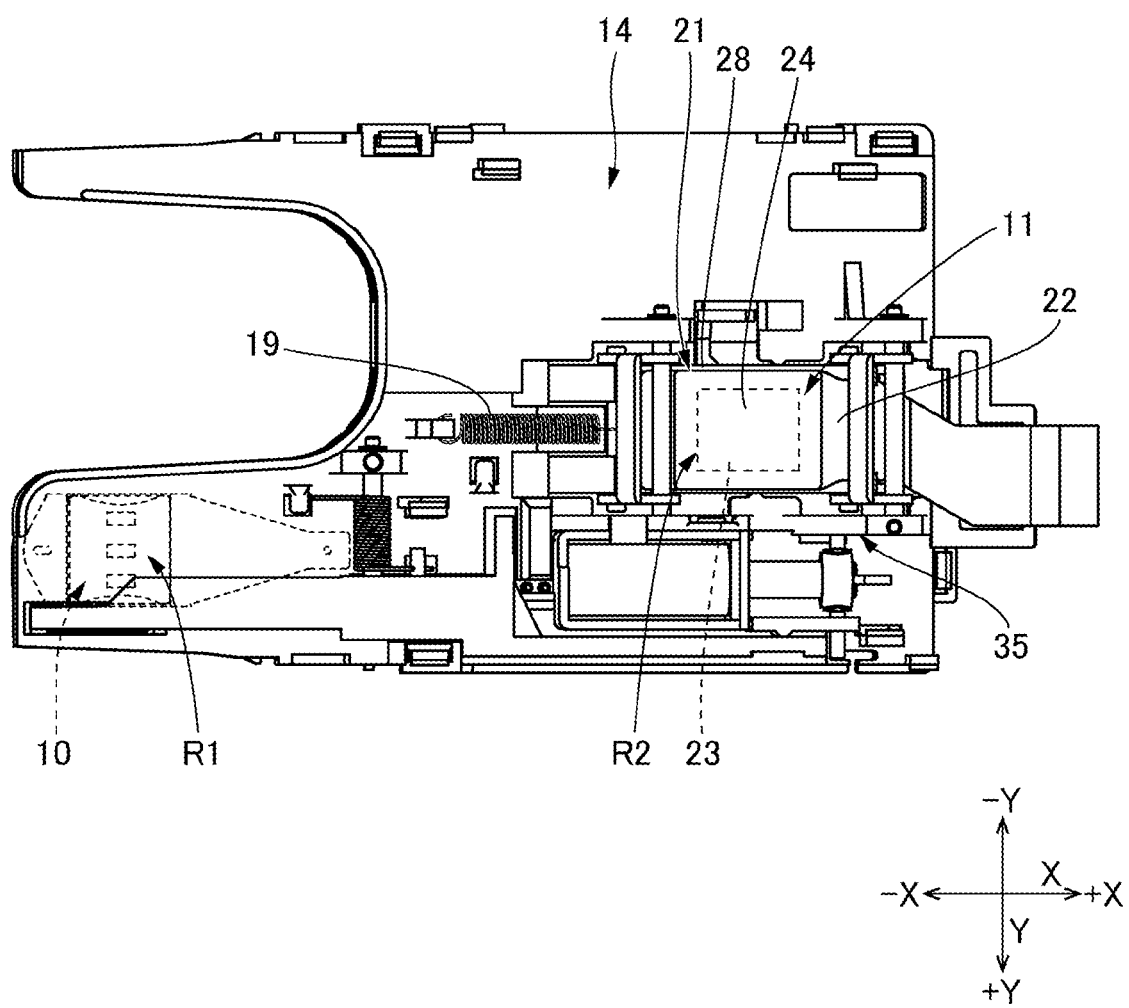
FIG. 4 is a plan view of the card reader from which a board, a fixed frame, and a front cover have been removed.
Figure 5:
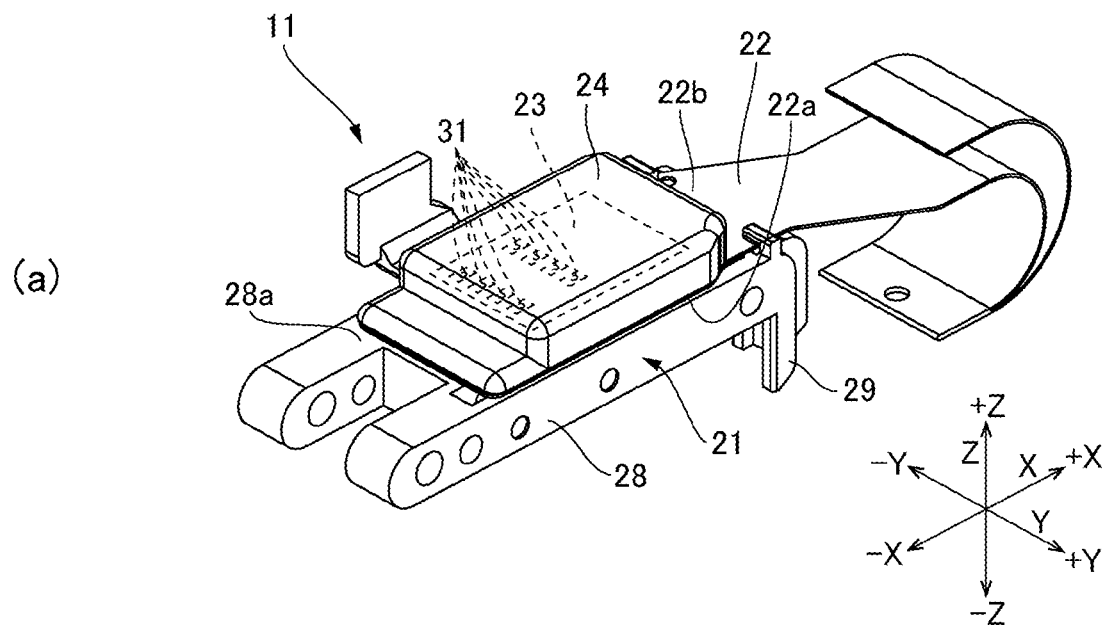
In FIG. 5, (a) and (b) are perspective views of an IC contact block unit.
Figure 5:
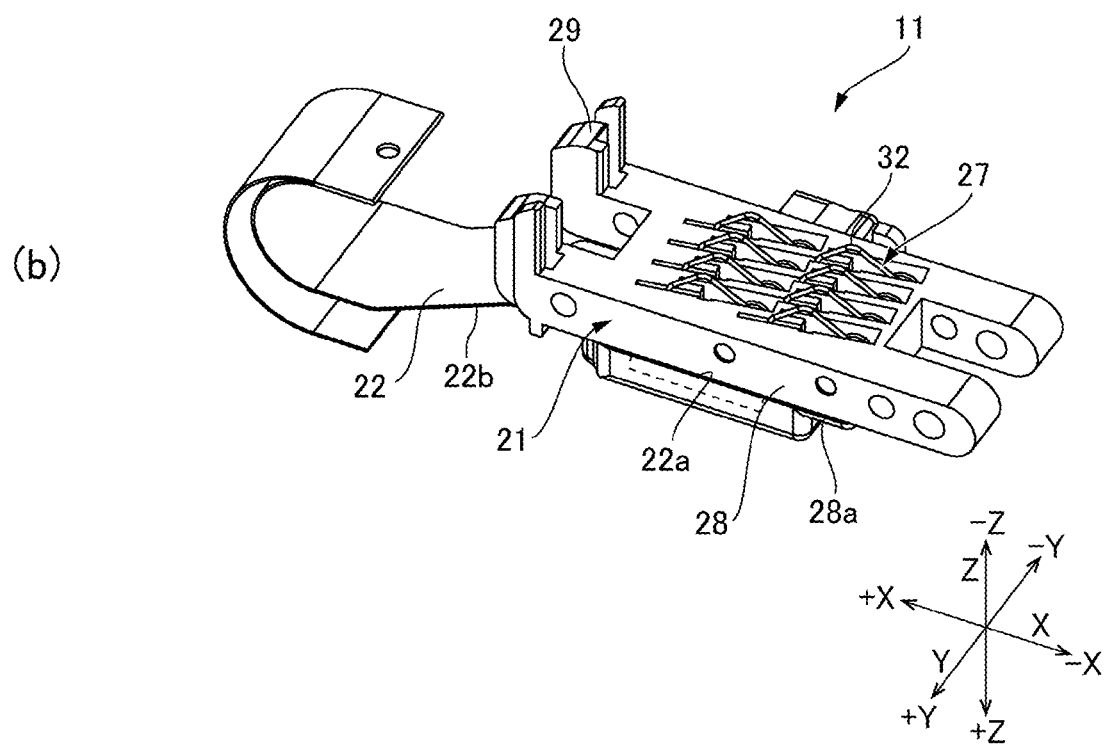

FIG. 1 is a perspective view of the card reader to which the present invention is applied. FIG. 2 is a plan view of a card to be processed by the card reader. FIG. 3 is an explanatory diagram of an internal structure of the card reader. FIG. 4 is a plan view of the card reader from which a board, a fixed frame, and a front cover have been removed. In FIG. 5, (a) and (b) are perspective views of an IC contact block unit. (a) of FIG. 5 is a perspective view of the IC contact block unit when viewed from a side of a resin sealing member, and (b) of FIG. 5 is a perspective view of the IC contact block unit when viewed from a side of an IC contact block. A card reader 1 is communicatively connected to a predetermined higher-level device while in use.

The card reader 1 reads information from a magnetic stripe 2a included in a card 2. Furthermore, the card reader 1 reads information stored in an IC chip 2b built in the card 2.

Moreover, the card reader 1 records information in the IC chip 2b built in the card 2.

As illustrated in FIG. 1, the card reader 1 is shaped like a flat cuboid as a whole. The card reader 1 includes a front cover 5 at one end thereof in its longitudinal direction. The front cover 5 includes a card insertion slot 6. Furthermore, as illustrated in FIG. 3, the card reader 1 includes a card passage 7 through which the card 2 passes after being inserted through the card insertion slot 6. The card passage 7 linearly extends in the longitudinal direction of the card reader 1 from the card insertion slot 6 through a first read/write position R1 and a second read/write position R2 (read position). At the first read/write position R1, information is read from the magnetic stripe 2a. At the second read/write position R2, information is read from the IC chip 2b, and information is written to the IC chip 2b. In this example, the user manually inserts the card 2 into the card insertion slot 6. Accordingly, the card 2 passes through the first read/write position R1. Further, the card 2 is placed at the second read/write position R2.

The card reader 1 includes a frame 4 including an end face defining the card passage 7, a magnetic head 10 provided at the first read/write position R1, and an IC contact block unit 11 provided at the second read/write position R2. The magnetic head 10 and the IC contact block unit 11 are located on opposite sides with the card passage 7 interposed therebetween. Furthermore, the card reader 1 includes a board 13 and a board 14 where various electronic components, and the like, are mounted, and a fixed frame 15 (see FIG. 1) that fixes the card reader 1 to the higher-level device where the card reader 1 is mounted.

In the following description, the longitudinal direction of the card reader 1 in which the card passage 7 extends is an X direction.

The direction on the side where the card insertion slot 6 is located in the X direction is a −X direction, and the opposite direction is a +X direction. The lateral direction of the card reader 1 perpendicular to the X direction is a Y direction. The direction on one side in the Y direction is a −Y direction, and the opposite direction is a +Y direction. Furthermore, the direction perpendicular to the X direction and the Y direction is a Z direction. The Z direction is a vertical direction when the card reader 1 is fixed to the higher-level device.

Moreover, the direction on one side in the Z direction is a −Z direction, and the opposite direction is a +Z direction. The −Z direction is a direction on the side where the magnetic head 10 is located with respect to the card passage 7 and is a downward direction when the card reader 1 is fixed to the higher-level device. The +Z direction is a direction on the side where the IC contact block unit 11 is located with respect to the card passage 7 and is an upward direction when the card reader 1 is fixed to the higher-level device.

As illustrated in FIG. 2, the card 2 inserted into the card reader 1 is made of vinyl chloride. The card 2 has substantially a rectangular planar shape. The card 2 has a thickness of approximately 0.7 to 0.8 mm. The back surface of the card 2 includes the magnetic stripe 2a where magnetic data is recorded.

Furthermore, the card 2 includes the built-in IC chip 2b. The front surface of the card 2 includes an external connection terminal 17 for the IC chip 2b. The card 2 complies with an international standard or JIS standard, and the magnetic stripe 2a is formed along the longitudinal direction of the card 2, which is formed in substantially a rectangular shape. Furthermore, the external connection terminal 17 is formed at one longitudinal end side of the card 2. The card 2 is inserted into the card insertion slot 6, with the one longitudinal end side of the card 2 inserted first, in such a manner that the surface including the external connection terminal 17 faces upward (+Z direction).

As illustrated in FIG. 3, the magnetic head 10 is located near the card insertion slot 6. Furthermore, as illustrated in FIG. 4, the magnetic head 10 is located at a position so as to face the magnetic stripe 2*a* of the card 2 inserted into the card insertion slot 6. With regard to the magnetic head 10, a sensor surface of the magnetic head 10 faces the card passage 7 from the −Z side.

Here, as illustrated in FIG. 3, the magnetic head 10 is supported by a plate spring 18 fixed to the frame 4. The magnetic head 10 is biased in the +Z direction due to the biasing force of the plate spring 18. Accordingly, the magnetic head 10 is brought into contact with the magnetic stripe 2*a* of the card 2 passing through the first read/write position R1.

The IC contact block unit 11 is provided on the +X side of the card reader 1.

As illustrated in FIG. 4, the IC contact block unit 11 includes an IC contact block 21, a flexible printed board 22, an encryption circuit 23 mounted on the flexible printed board 22, and a resin sealing member 24.

As illustrated in (b) of FIG. 5, the IC contact block 21 includes a contact spring 27 capable of being in contact with the external connection terminal 17 of the IC chip 2*b* of the card 2 and a holder 28 that holds the contact spring 27. The IC contact block 21 and the encryption circuit 23 are electrically connected to each other via the flexible printed board 22. As illustrated in (a) of FIG. 5, a distal end portion of the flexible printed board 22 is placed on the +Z side of the holder 28. Accordingly, a first surface 22*a* of the flexible printed board 22 on the −Z side is in contact with the holder 28. The holder 28 includes a contact surface 28*a* that is in contact with the first surface 22*a* of the flexible printed board 22. Moreover, the holder 28 includes a downwardly projecting card engagement portion 29 at the end portion thereof in the +X direction. A rear end of the flexible printed board 22 is coupled to the board 13.

The encryption circuit 23 is mounted at the distal end portion of the flexible printed board 22 and on a second surface 22*b* opposite to the first surface 22*a*. The resin sealing member 24 integrally covers, from the +Z direction, the area where the contact spring 27 is coupled (a spring end 31 of the contact spring 27) and the area where the encryption circuit 23 is mounted in the distal end portion of the flexible printed board 22.

As illustrated in FIG. 3, in the IC contact block unit 11, the contact spring 27 is provided so as to face the card passage 7 from the +Z side. The holder 28 is supported by an end portion of the frame 4 on the +Z side via a parallel link mechanism 35. Furthermore, the holder 28 is biased in the −X direction by an extension coil spring 19. The IC contact block unit 11 is lowered due to a movement in the +X direction and is raised due to a movement in the −X direction by the parallel link mechanism 35.

Both the board 13 and the board 14 are rigid boards. Both the board 13 and the board 14 have a rectangular planar shape. The board 13 is larger than the board 14. The board 13 is fixed to the frame 4 to cover, from the +Z direction, the +X side area of the frame 4 with respect to the front cover 5. The board 13 is a main board where a control circuit, and the like, for the card reader 1 is mounted. The encryption circuit 23 and the contact spring 27 are coupled to the main board via the flexible printed board 22.

(Operation of Card Reader)

When the card 2 is inserted into the card insertion slot 6, the magnetic stripe 2*a* of the card 2 passes through the first read/write position R1. Here, the card reader 1 drives the magnetic head 10 to read information from the magnetic stripe 2*a*.

Then, when the card 2 is further pushed in the +X direction, an end 2*c* of the card 2 is brought into contact with the card engagement portion 29 of the IC contact block 21. In this state, when the card 2 is further pushed in the +X direction, the card 2 pushes the card engagement portion 29 in the +X direction so that the IC contact block unit 11 moves in the +X direction. Accordingly, the IC contact block unit 11 is lowered so that the contact spring 27 is brought into contact with the external connection terminal 17 of the card 2 located in the second read/write position R2. Here, the card reader 1 reads information from the IC chip 2*b* or writes information to the IC chip 2*b* via the IC contact block 21. The encryption circuit 23 encrypts the information acquired from the IC chip 2*b* via the IC contact block 21 and decrypts the information transmitted from the higher-level device to be written to the IC chip 2*b* via the IC contact block 21.

The information read from the magnetic stripe 2*a* by the card reader 1 and the information read from the IC chip 2*b* by the card reader 1 and encrypted by the encryption circuit 23 are transmitted to the higher-level device via the control circuit of the board 13. Furthermore, the information written to the IC chip 2*b* by the card reader 1 is supplied from the higher-level device to the card reader 1.

(Details of IC Contact Block Unit)

Figure 6:
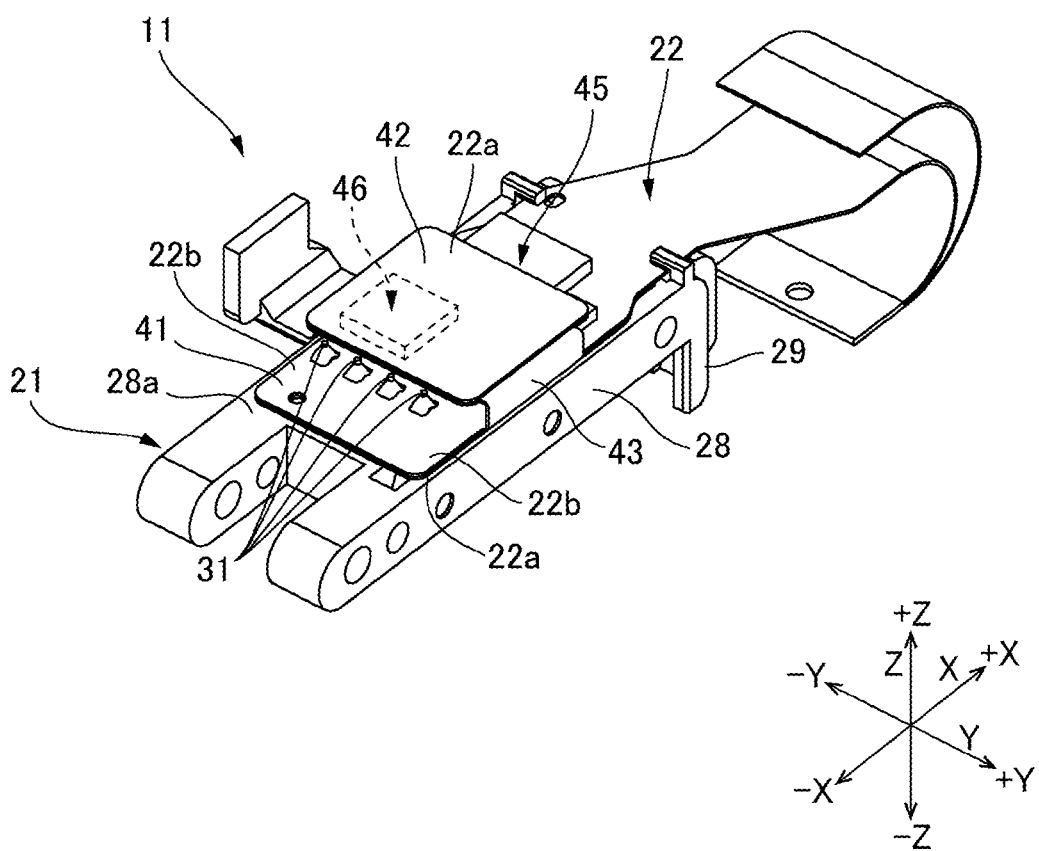
FIG. 6 is a perspective view of the IC contact block unit from which a resin sealing member has been removed.
Figure 7:
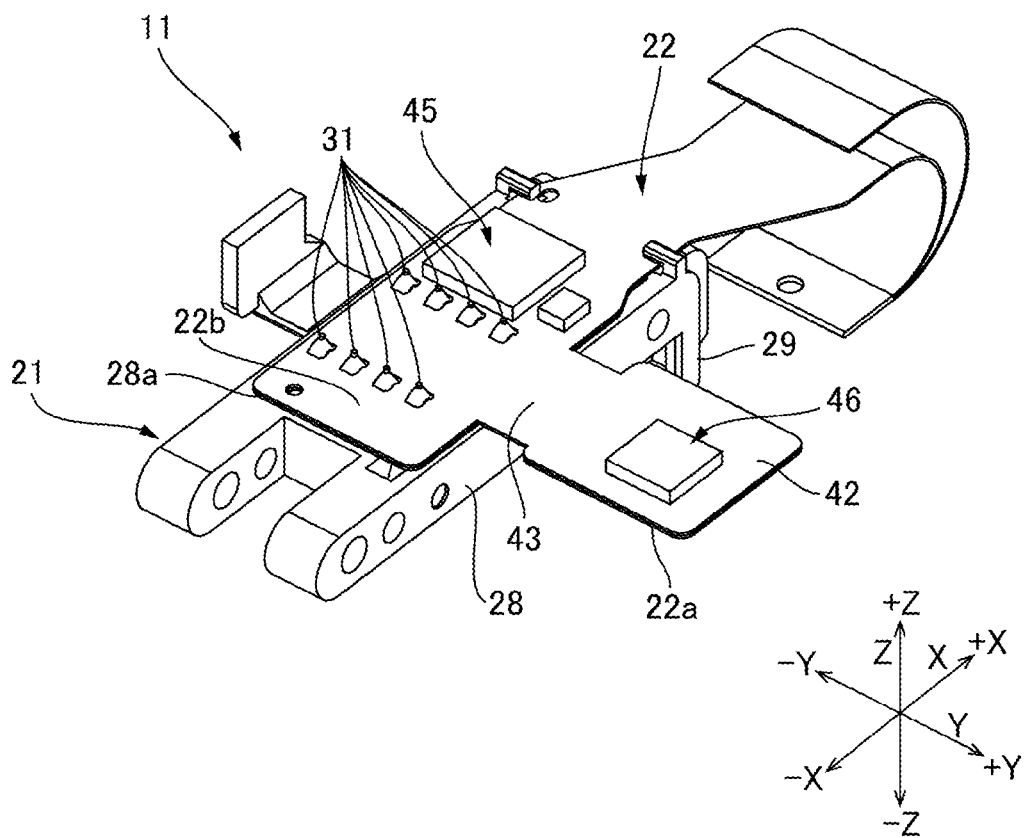
FIG. 7 is a perspective view of the IC contact block unit when a flexible printed board is unfolded.

Next, the IC contact block unit 11 is described in detail. FIG. 6 is a perspective view of the IC contact block unit 11 from which the resin sealing member 24 has been removed. FIG. 7 is a perspective view of the IC contact block unit 11 when the flexible printed board 22 is unfolded.

As illustrated in (a) and (b) of FIG. 5, the IC contact block 21 includes the contact spring 27 and the holder 28. As illustrated in FIG. 3, and (a) and (b) of FIG. 5, the contact spring 27 includes a contact portion 32 projecting in the −Z direction from the holder 28 and the spring end 31 projecting in the +Z direction from the contact surface 28*a* of the holder 28 in contact with the flexible printed board 22. The contact portion 32 is bent in a V-shape along the X direction. The contact portion 32 is brought into elastic contact with the external connection terminal 17 of the card 2 when the IC contact block unit 11 is lowered. The spring end 31 is coupled to the flexible printed board 22 in such a manner that the spring end 31 penetrates the flexible printed board 22 from the side of the first surface 22*a* to the side of the second surface 22*b*.

As illustrated in FIG. 6, the flexible printed board 22 includes a rectangular-shaped first board portion 41 having the first surface 22*a* extending in contact with the IC contact block 21, a square-shaped second board portion 42 facing the first board portion 41 with a gap interposed therebetween on the side of the second surface 22*b* of the first board portion 41, and a coupling board portion 43 coupling the first board portion 41 and the second board portion 42. The coupling board portion 43 extends in the Z direction to couple an end portion of the first board portion 41 on the +Y side and an end portion of the second board portion 42 on the +Y side. Here, when the flexible printed board 22 is converted on a plane, as illustrated in FIG. 7, the first board portion 41, the coupling board portion 43, and the second board portion 42 are provided in this order along the Y direction at the distal end portion thereof. Thus, the coupling board portion 43 is bent and the second board portion 42 is overlapped with the first board portion 41 in the +Z direction due to folding so that the first board portion 41 and the second board portion 42 face each other in the Z direction. The spring end 31 of the contact spring 27 penetrates the first board portion 41 in the Z direction. When viewed in the Z direction (the facing direction in which the first board portion 41 and the second board portion 42 face each other), the spring end 31 and the second board portion 42 are overlapped with each other.

The encryption circuit 23 is mounted on the second surface 22*b* of the flexible printed board 22 and is electrically connected to the contact spring 27. The encryption circuit 23 includes a first circuit portion 45 mounted on the second surface 22*b* of the first board portion 41 and a second circuit portion 46 mounted on the second surface 22*b* of the second board portion 42. When the second board portion 42 is overlapped with the first board portion 41 due to folding, the first circuit portion 45 and the second circuit portion 46 are located between the first board portion 41 and the second board portion 42 in the Z direction.

Here, as illustrated in (a) of FIG. 5, the resin sealing member 24 integrally covers the spring end 31 and the encryption circuit 23. Furthermore, the resin sealing member 24 seals the gap between the first board portion 41 and the second board portion 42. Moreover, the resin sealing member 24 covers the second board portion 42 on the side of the first surface 22*a* and the coupling board portion 43. Accordingly, the resin sealing member 24 seals the spring end 31 of the contact spring 27, a wiring pattern coupling the spring end 31 and the encryption circuit 23 on the flexible printed board 22, and the encryption circuit 23.

Advantageous Effect

In this example, the contact spring 27 of the IC contact block 21 is coupled to the flexible printed board 22 where the encryption circuit 23 is mounted. Accordingly, the information acquired from the IC chip 2*b* of the card 2 via the IC contact block 21 may be encrypted by the encryption circuit 23 at the encryption circuit 23. Furthermore, the resin sealing member 24 integrally covers the spring end 31 of the contact spring 27 and the encryption circuit 23. Accordingly, the resin sealing member 24 seals the spring end 31 of the contact spring 27, a wiring pattern coupling the spring end 31 and the encryption circuit 23 on the flexible printed board 22, and the encryption circuit 23. This leads to difficulty in external physical access to the spring end 31 of the contact spring 27, the wiring pattern coupling the spring end 31 and the encryption circuit 23 on the flexible printed board 22, and the encryption circuit 23. Thus, it is possible to prevent a person who intends to commit a fraud from acquiring unencrypted information.

Moreover, as the encryption circuit 23 is mounted on the flexible printed board 22, the encryption circuit 23 including the board may be made small as compared to the case where the encryption circuit 23 is mounted on a rigid board.

Furthermore, in this example, the holder 28 of the IC contact block 21 is in contact with the first surface 22*a* of the flexible printed board 22, the spring end 31 projects from the contact surface 28*a* of the holder 28 in contact with the flexible printed board 22, and the spring end 31 is coupled to the flexible printed board 22 in such a manner that the spring end 31 penetrates the flexible printed board 22 from the side of the first surface 22*a* to the side of the second surface 22*b* opposite to the first surface 22*a*. Furthermore, the encryption circuit 23 is mounted on the second surface 22*b* of the flexible printed board 22, and the resin sealing member 24 is provided on the side of the second surface 22*b* of the flexible printed board 22. Accordingly, the flexible printed board 22 having the encryption circuit 23 mounted thereon may be overlapped with the IC contact block 21. Moreover, as the spring end 31 penetrates the flexible printed board 22, the coupling strength between the IC contact block 21 and the flexible printed board 22 is high as compared to the case where the spring end 31 is coupled to one side of the flexible printed board 22.

Furthermore, the flexible printed board 22 includes the first board portion 41 having the first surface 22*a* extending in contact with the IC contact block 21, the second board portion 42 facing the first board portion 41 with a gap interposed therebetween on the side of the second surface 22*b* of the first board portion 41, and the coupling board portion 43 coupling the first board portion 41 and the second board portion 42. Accordingly, it is easy to ensure the area for mounting the encryption circuit 23 on the flexible printed board 22. Furthermore, as the first board portion 41 and the second board portion 42 are overlapped with each other, the encryption circuit 23 may be made compact while the area for mounting the encryption circuit 23 on the flexible printed board 22 is ensured.

Furthermore, when viewed in the Z direction, the second board portion 42 of the flexible printed board 22 is overlapped with the spring end 31. Accordingly, it is more difficult for a person who intends to commit a fraud to physically access the spring end 31 of the contact spring 27.

Furthermore, the resin sealing member 24 seals the gap between the first board portion 41 and the second board portion 42 and covers the second board portion 42 on the side of the first surface 22*a* and the coupling board portion 43. As the resin sealing member 24 covers the first board portion 41, the second board portion 42, the coupling board portion 43, the first circuit portion 45, the second circuit portion 46, and the spring end 31, it is difficult to identify what is sealed inside the resin sealing member 24. Therefore, it is more difficult for a person who intends to commit a fraud to acquire unencrypted information. Moreover, with this configuration, it is possible to increase the rigidity of the relatively soft flexible printed board 22 and to mount the encryption circuit 23 and the spring end 31 on the flexible printed board in a stable manner.

Here, the card reader 1 may write information to the magnetic stripe 2*a* at the first read/write position R1. In this case, the information written to the magnetic stripe 2*a* by the card reader 1 is supplied from the higher-level device to the card reader 1.

Furthermore, the present invention is applicable to a card reader that includes a card transport mechanism using a motor, or the like, as a drive source and uses the card transport mechanism to move the card 2 along the card passage 7.

DESCRIPTION OF REFERENCE NUMERALS

1 Card reader
2 Card
2*a* Magnetic stripe
2*b* IC chip
2*c* End
4 Frame
5 Front cover
6 Card insertion slot
7 Card Passage
10 Magnetic head
11 IC contact block unit
13, 14 Board 15 Fixed frame
17 External connection terminal
18 Plate spring
19 Extension coil spring
21 IC contact block
22 Flexible printed board
22a First surface
22b Second surface
23 Encryption circuit
24 Resin sealing member
27 Contact spring
28 Holder
28a Contact surface
29 Card engagement portion
31 Spring end
32 Contact portion
35 Parallel link mechanism
41 First board portion
42 Second board portion
43 Coupling board portion
45 First circuit portion
46 Second circuit portion
R1 First read/write position
R2 Second read/write position (read position)

The invention claimed is:

1. A card reader comprising:
an integrated circuit contact block, including a contact spring capable of being in contact with an external connection terminal of an integrated circuit chip built in a card and capable of acquiring information stored in the integrated circuit chip of the card;
a flexible printed board which is attached to the integrated circuit contact block and to which a spring end of the contact spring of the integrated circuit contact block is coupled;
an encryption circuit, mounted on the flexible printed board and electrically connected to the contact spring to encrypt the information acquired from the integrated circuit chip via the contact spring of the integrated circuit contact block; and
a resin sealing member that integrally covers the spring end and the encryption circuit;
wherein the spring end of the contact spring projects from a surface of the flexible printed board on which the encryption circuit is mounted, and both of the spring end of the contact spring and the encryption circuit are sealed by the resin sealing member;
wherein
the integrated circuit contact block includes: a holder that holds the contact spring,
the holder is in contact with a first surface of the flexible printed board,
the spring end projects from a contact surface of the holder in contact with the flexible printed board,
the spring end is coupled to the flexible printed board in such a manner that the spring end penetrates the flexible printed board from a side of the first surface to a side of a second surface opposite to the first surface,
the encryption circuit is mounted on the second surface of the flexible printed board, and
the resin sealing member is provided on the side of the second surface of the flexible printed board;
wherein the flexible printed board includes:
a first board portion, having the first surface extending in contact with the integrated circuit contact block;
a second board portion, facing the first board portion with a gap interposed therebetween on the side of the second surface of the first board portion; and
a coupling board portion, coupling the first board portion and the second board portion,
wherein the spring end penetrates the first board portion, and
wherein the encryption circuit includes:
a first circuit portion, mounted on the second surface of the first board portion; and
a second circuit portion, mounted on the second surface of the second board portion;
wherein the second board portion is overlapped with the spring end, when viewed in a facing direction in which the first board portion and the second board portion face each other;
wherein the resin sealing member seals a gap between the first board portion and the second board portion and covers the second board portion on the side of the first surface and the coupling board portion.

* * * * *